United States Patent
Treubel et al.

(10) Patent No.: US 11,163,239 B2
(45) Date of Patent: Nov. 2, 2021

(54) METHOD, MEASURING SYSTEM AND LITHOGRAPHY APPARATUS

(71) Applicant: Carl Zeiss SMT GmbH, Oberkochen (DE)

(72) Inventors: Frank Treubel, Essingen (DE); Christoph Fetzer, Neu-Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/066,076

(22) Filed: Oct. 8, 2020

(65) Prior Publication Data
US 2021/0026252 A1    Jan. 28, 2021

Related U.S. Application Data

(63) Continuation of application No. PCT/EP2019/059643, filed on Apr. 15, 2019.

(30) Foreign Application Priority Data

Apr. 16, 2018  (DE) .......................... 102018205714.1

(51) Int. Cl.
*G03F 7/20* (2006.01)
*G02B 5/08* (2006.01)
*G02B 7/182* (2021.01)

(52) U.S. Cl.
CPC ....... *G03F 7/70825* (2013.01); *G02B 5/0891* (2013.01); *G02B 7/1827* (2013.01); *G03F 7/7085* (2013.01); *G03F 7/70166* (2013.01); *G03F 7/70258* (2013.01)

(58) Field of Classification Search
CPC ...... G02B 5/0891; G02B 7/005; G02B 7/182; G02B 7/1827; G03F 7/70166; G03F 7/70258; G03F 7/70825; G03F 7/7085
USPC ..... 355/55, 67, 68, 77; 359/212.1, 872–877; 430/30
See application file for complete search history.

(56) References Cited

U.S. PATENT DOCUMENTS

2009/0021847 A1    1/2009  Ryo
2020/0012197 A1*   1/2020  Niederhausen ........ G06K 9/627

FOREIGN PATENT DOCUMENTS

| DE | 10 2008 041 310 A1 | 3/2009 |
|---|---|---|
| DE | 10 2011 087 389 A1 | 7/2012 |
| DE | 10 2017 200 633 A1 | 3/2017 |
| DE | 10 2017 204 685 A1 | 6/2017 |
| WO | WO 2018/172399 A1 | 9/2018 |

OTHER PUBLICATIONS

International Search Report and Written Opinion for corresponding PCT Appl No. PCT/EP2019/059643, dated Jun. 18, 2019.

* cited by examiner

*Primary Examiner* — Colin W Kreutzer
(74) *Attorney, Agent, or Firm* — Fish & Richardson P.C.

(57) ABSTRACT

A method for localizing an abnormality in a travel path of an optical component in or for a lithography apparatus includes: a) moving the optical component in at least one first degree of freedom; b) detecting a movement ($R_z$) of the optical component and/or a force acting on the optical component in at least one second degree of freedom; and c) localizing the abnormality as a function of the movement detected in b) and/or the force detected in b).

20 Claims, 8 Drawing Sheets

METHOD, MEASURING SYSTEM AND LITHOGRAPHY APPARATUS

CROSS-REFERENCE TO RELATED APPLICATIONS

The present application is a continuation of, and claims benefit under 35 USC 120 to, international application PCT/EP2019/059643, filed Apr. 15, 2019, which claims benefit under 35 USC 119 of German Application No. 10 2018 205 714.1, filed Apr. 16, 2018. The entire disclosure of these applications are incorporated by reference herein.

FIELD

The present disclosure relates to a method for localizing an abnormality in a travel path of an optical component in or for a lithography apparatus. Furthermore, the present disclosure relates to a measuring system and a lithography apparatus.

BACKGROUND

Microlithography can be used for producing microstructured components, for example integrated circuits. The microlithographic process can be performed using a lithography apparatus, which typically has an illumination system and a projection system. An image of a mask (reticle) illuminated by the illumination system can be projected by the projection system onto a substrate (for example a silicon wafer) which can be coated with a light-sensitive layer (photoresist) and arranged in the image plane of the projection system, in order to transfer the mask structure to the light-sensitive coating of the substrate.

Generally, in lithography apparatuses, such as in EUV lithography apparatuses and there primarily in illumination lenses, modules are used which include a plurality of optical components that are regulated actively—for example via Lorentz actuators. The optical components can include mirrors.

The optical components are desirably capable of being positioned within a specified, multidimensional travel path, such as in six degrees of freedom. The specification of the travel path provides both a minimum and a maximum travel path. In this case, the maximum travel path is desirably such that the corresponding optical component does not collide with a delimitation in an uncontrolled manner and incur damage as a result. The reason for such a collision may be, for example, a mechatronic instability, incorrect operation or a vibration during transport of the corresponding illumination lens.

Mechanical delimitations have become known which mechanically delimit the travel path of the optical component.

Usually, during regulation operation of the lithography apparatus, such a mechanical delimitation provides an air gap between the optical component and an end stop (also referred to as mechanical end stop) mounted on the supporting frame. In the case of a fault, the optical component strikes the end stop. However, generally, the full travel path can be used with predefined minimum force expenditure only if the air gap is free of particles. Despite diverse measures implemented in EUV lithography apparatuses in order to avoid contamination, it can happen that such particles nevertheless pass to a corresponding air gap.

A further scenario in which the full travel path is not available is that an air-gap-side coating on the optical component or the end stop is faulty. The coating may have spalling, inclusions or inhomogeneities, for example.

The full travel path may also not be available if the mounting of the end stop relative to the optical component was performed erroneously.

Outage times in the case of lithography apparatuses can lead to great financial losses, it can be desirable to detect as fast as possible the above-described abnormalities which lead to a premature contact and thus to an undesired restriction of the travel path.

SUMMARY

The present disclosure seeks to provide an improved method for localizing an abnormality in a travel path of an optical component in or for a lithography apparatus. The disclosure also seeks to provide an improved measuring system and an improved lithography apparatus.

A method for localizing an abnormality in a travel path of an optical component in or for a lithography apparatus including the following steps is provided:
a) moving the optical component in at least one first degree of freedom,
b) detecting a movement of the optical component and/or a force acting on the optical component in at least one second degree of freedom, and
c) localizing the abnormality as a function of the movement detected in step b) and/or the force detected in step b).

The concept underlying the present disclosure involves drawing conclusions about an abnormality in the first degree of freedom by observing a second degree of freedom (which is a degree of freedom different from the first degree of freedom) of the optical component. As a result, a corresponding abnormality can be rapidly localized, thereby reducing outage times of the lithography apparatus.

A "travel path" should be understood to mean a sequence of setpoint positions of the optical component.

An "abnormality" should be understood to mean a structural cause which has the consequence that the optical component at least partly cannot be moved along the travel path (that is to say that the setpoint position thereof deviates from the actual position thereof by a predefined value) or the travel path can be travelled only with an increased force expenditure (which is impermissible for example for thermodynamic reasons) (that is to say that the setpoint force deviates from the actual force by a predefined value).

The abnormality can be selected for example from:
a particle in the air gap; this can be either a hard or a soft particle. A hard particle will lead to the fault situation if its size can no longer be compensated for by a (soft) coating, for example in the form of an elastomer, for example a fluoroelastomer (obtainable inter alia under the tradename Viton), on the optical component or on the end stop. A soft particle will lead to the fault situation if, for example, no (soft) coating at all is provided on the optical component or on the end stop;
a coating fault on the end stop and/or on the optical component, including for example spalling, inclusions or inhomogeneities; and
a fault alignment of the end stop relative to the optical component.

The first and second degrees of freedom can be selected in each case from up to six degrees of freedom. The six degrees of freedom include three translational and three rotational degrees of freedom.

"Moving" the optical component is taken to mean an actual position change thereof. The actual position change is described by translation and/or rotational vectors (up to six degrees of freedom). The actual position change results from the comparison of two actual positions of the optical component at different points in time.

"Detecting a movement" of the optical component is taken to mean that a movement of the optical component is detected indirectly or directly by a sensor mechanism. The movement is detected by detecting actual positions of the optical component at at least two different points in time.

"Localizing" the abnormality can include for example locating the abnormality in a coordinate system. Accordingly, an output describing the position of the abnormality in x-, y- and z-coordinates can be effected. The coordinate system can be linked to the optical component, the measuring system or the lithography apparatus (for example a sensor frame thereof). For example, the assignment to one or more end stops delimiting the movement of the optical component can be effected.

In the present case, an "end stop" should be understood to mean a mechanical delimitation of the travel path of the optical component.

In so far as reference is made to a force in the present case, this also always encompasses the possibility that a torque is detected instead of (or in addition to) a force.

Optionally, in step b), the movement of the optical component and the force acting on the optical component are detected in at least one second degree of freedom. By monitoring these two parameters, it is possible for an abnormality to be localized even more rapidly.

In so far as method steps are designated by a), b) and c) in the present case, this serves merely for better differentiation. A specific order of the steps is not predefined thereby. An alteration of the designation of the method steps (method step a) becomes method step b)), the insertion of further method steps (for example the insertion of a new method step between method steps a) and b), wherein then the new method step is designated as method step b) and the earlier method step b) is designated as method step c) and the addition of further method steps (for example of a method step d)) are not thereby excluded, but rather encompassed by the present disclosure.

In accordance with one embodiment, the first or second degree of freedom is a translational degree of freedom and the respective other degree of freedom is a rotational degree of freedom.

Experiments by the applicant have shown that it is possible to localize abnormalities in a translational degree of freedom relatively well by consulting a rotational degree of freedom, and vice versa.

In accordance with some embodiments, the first degree of freedom is a translational degree of freedom and the second degree of freedom is a rotational degree of freedom.

In this case, therefore, the first degree of freedom describes a translation of the optical component along the translation vector. The second degree of freedom describes a rotation of the optical component about the corresponding rotation vector. The translation vector and the rotation vector are optionally oriented perpendicularly to one another. For example, in step a) the optical component can be moved in at least one first and one second degree of freedom, wherein the first and second degrees of freedom are in each case translational degrees of freedom. In this case, the corresponding translation vectors of the first and second degrees of freedom are oriented perpendicularly to one another. Accordingly, the translation vectors describe a plane. Furthermore, in this case, by way of example, step b) involves detecting a movement of the optical component and/or a force (and/or torque) acting on the optical component in at least one third degree of freedom. In this case, the third degree of freedom is a rotational degree of freedom. The latter is described by a rotation vector oriented perpendicularly to the above-described plane defined by the two translation vectors. Experiments by the applicant have revealed that, in this embodiment, it is possible to localize abnormalities in the plane in a relatively simple manner via a rotation about the rotation vector perpendicularly to the plane and/or via a detected torque about the rotation vector perpendicularly to the plane. In this case, the travel path of the optical component lies in the plane.

In accordance with some embodiments, moving the optical component in accordance with step a) is limited by at least one end stop.

For example, the optical component, as described above, in step a), can also be moved in at least one first and one second translational degree of freedom. Each of these degrees of freedom can be limited by a corresponding end stop. This encompasses a fact that one of the same end stop (mechanical stop) can limit two or more degrees of freedom, that is to say can act like at least two end stops in different degrees of freedom.

In accordance with some embodiments, moving the component in step a) is carried out in accordance with a predefined path or predefined movement pattern.

The predefined path or the predefined movement pattern can be stored for example on a storage unit (for example hard disk or solid state drive).

In accordance with some embodiments, the predefined movement pattern has a plurality of translational movements of the optical component in a plane, the translational movements proceeding from a centre point.

The predefined movement pattern can thus have for example a number A of spokes (of an imaginary wheel). The spokes can be in each case at an identical angle to one another. Depending on the desired properties/application, it is possible for the angles also not to be identical. A can be for example ≥3, 4, 7, 8, 9, 12, 13, 15, 16 or 20, wherein A is an integer.

In accordance with some embodiments, localizing the abnormality in step c) is additionally carried out as a function of the predefined path or the predefined movement pattern (BM) and/or as a function of an actuation force, that moves the optical component in step a).

In other words, therefore, in step c), the abnormality is localized not only as a function of the movement detected in step b) and/or the force detected in step b), rather further parameters are taken into account. According to the present embodiment, the further parameters are the predefined path or the predefined movement pattern or an actuation force. In this case, the actuation force can be taken into account in two different ways in step c). Firstly, in the form of a setpoint actuation force, that is to say a force commanded to the actuator that moves the optical component in the at least one first degree of freedom. Such a force can be read out from a corresponding control device, for example. Secondly, it is possible (additionally or alternatively) to take account of an actual actuation force measured (by a sensor mechanism) in step c).

In accordance with some embodiments, the movement of the optical component in accordance with step a) is detected and localizing the abnormality in step c) is additionally carried out as a function of the detected movement In such embodiments, the movement of the optical component in step a) can be detected via sensors, for example in real time, and can be taken into account when localizing the abnormality in step c). In this case, therefore, it can be that what are taken into account in step c) are setpoint movements commanded to the corresponding actuator or a feed-forward control and/or regulation unit connected upstream thereof, but instead actual movements.

In accordance with some embodiments, localizing the abnormality in step c) is additionally carried out as a function of a position of a rotation vector, describing a rotation of the optical component, in relation to the at least one end stop.

The relationship of the position of the at least one end stop, the (predefined) movement of the optical component and the (predefined) actuation force permits rapid conclusions for the localization of the abnormality.

In accordance with some embodiments, in step c) it is ascertained that at least one end stop has the abnormality.

Accordingly, an assignment of the abnormality to an end stop thus takes place. The abnormality is typically allocated to one of a plurality of end stops.

In accordance with some embodiments, the at least one end stop has a peg, which engages into a cutout of the optical component. There is a ring gap between the peg at the cutout.

In the present case, the "ring gap" is also referred to as "air gap". However, a vacuum, for example a high vacuum, can and will generally prevail in the ring gap. It is also possible to provide at least two, three or more end stops, each having the construction described above. End stops of this type can allow a relatively precise delimitation of the travel path.

In accordance with some embodiments, the abnormality is a particle in the ring gap, a coating fault of the cutout and/or of the peg and/or an erroneous alignment of the peg relative to the cutout.

In the case where a plurality of end stops are provided, the abnormality can be a particle in at least one ring gap, a coating fault in at least one cutout and/or in at least one peg and/or an erroneous alignment of at least one peg relative to at least one cutout.

In accordance with some embodiments, the optical component is a mirror, a lens element, an optical grating or a lambda plate.

Mirrors are generally suitable for EUV lithography apparatuses, whereas lens elements are generally suitable for DUV lithography apparatuses.

In accordance with some embodiments, the cutouts are formed in the optical element and the pegs are formed on a supporting frame.

The cutouts can be for example cylindrical, for example circular-cylindrical (that is to say holes or bores) cutouts and the pegs can be cylindrical, for example circular-cylindrical, pegs. The cutouts can be formed as continuous or non-continuous (blind holes) cutouts.

Furthermore, a measuring system for localizing an abnormality plurality in a travel path of an optical component in or for a lithography apparatus is provided. The measuring system includes the following: an actuator for moving the optical component in at least one first degree of freedom a sensor unit for detecting a movement of the optical component and/or a force acting on the optical component in at least one second degree of freedom, and a computer unit for localizing the abnormality as a function of the movement detected in step b) and/or the force detected in step b).

A measuring system of this type can be embodied as a stand-alone solution or be integrated into a lithography apparatus. In the case of a stand-alone solution, the measuring system can be used for example in such a way that a module including an optical component and an end stop is demounted from a lithography apparatus and inserted into the measuring system if the lithography apparatus ascertains an abnormality in the travel path of the optical component. The measuring system then processes the method steps described above in order to localize the abnormality.

Equally, however, a lithography apparatus can also include the measuring system in an integrated manner. Optionally, the lithography apparatus can indicate the localized fault in an output device. A repair can accordingly be carried out in a targeted manner.

Accordingly, the following is provided: a lithography apparatus including an optical component and a measuring system configured to localize an abnormality in a travel path of the optical component.

The features and aspects described for the method are correspondingly applicable to the measuring system and the lithography apparatus, and vice versa.

"A(n); one" in the present case should not necessarily be understood as restrictive to exactly one element. Rather, a plurality of elements, such as, for example, two, three or more, can also be provided, provided that nothing to the contrary is indicated.

Further possible implementations of the disclosure also include not explicitly mentioned combinations of features or embodiments that are described above or below with respect to the exemplary embodiments. In this case, the person skilled in the art will also add individual aspects as improvements or supplementations to the respective basic form of the disclosure.

BRIEF DESCRIPTION OF THE DRAWINGS

Further configurations and aspects of the disclosure are the subject matter of the dependent claims and also of the exemplary embodiments of the disclosure described below. In the text that follows, the disclosure is explained in more detail on the basis of exemplary embodiments with reference to the accompanying figures, in which.

DESCRIPTION OF EXEMPLARY EMBODIMENTS

Identical elements or elements having an identical function have been provided with the same reference signs in the figures, unless indicated to the contrary. It should also be noted that the illustrations in the figures are not necessarily true to scale.

Figure 1A:
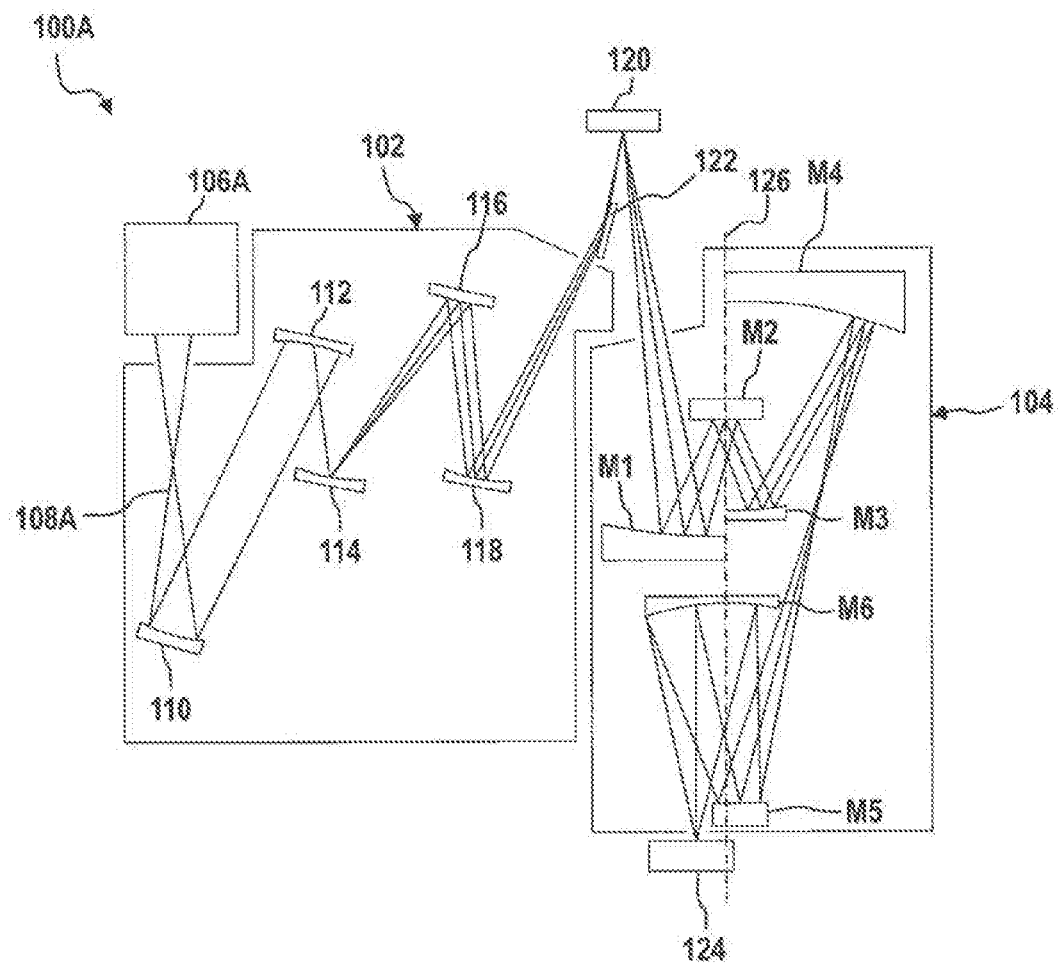
FIG. 1A shows a schematic view of an embodiment of an EUV lithography apparatus.

FIG. 1A shows a schematic view of an EUV lithography apparatus 100A, which includes a beam shaping and illumination system 102 and a projection system 104. In this case, EUV stands for "extreme ultraviolet" and refers to a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (called a reticle) 120. The photomask 120 is likewise formed as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number represented. A greater or lesser number of mirrors M1 to M6 can also be provided. Furthermore, the mirrors M1 to M6 are generally curved on their front face for beam shaping.

Figure 1B:
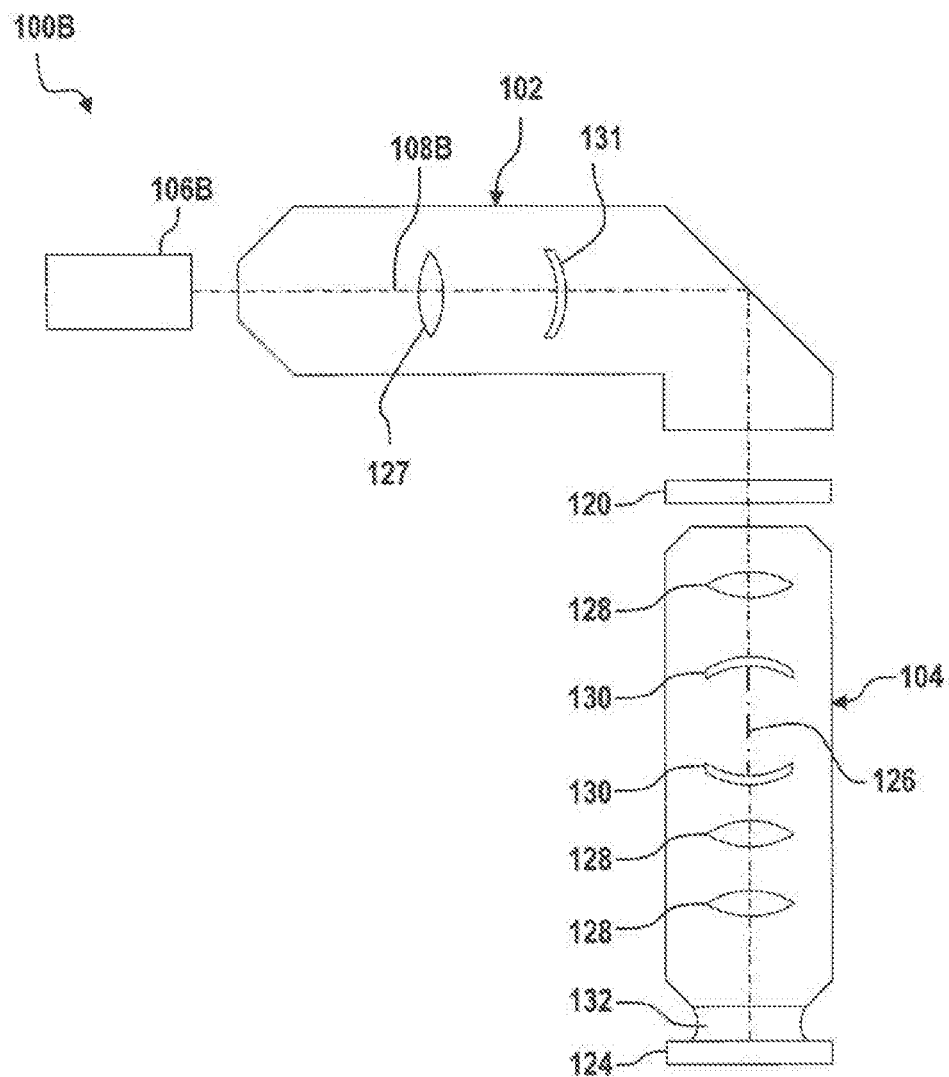
FIG. 1B shows a schematic view of an embodiment of a DUV lithography apparatus.

FIG. 1B shows a schematic view of a DUV lithography apparatus 100B, which includes a beam shaping and illumination system 102 and a projection system 104. In this case, DUV stands for "deep ultraviolet" and refers to a wavelength of the working light of between 30 nm and 250 nm. As has already been described with reference to FIG. 1A, the beam shaping and illumination system 102 and the projection system 104 can be arranged in a vacuum housing and/or surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B includes lens elements 127 and/or mirrors 131 (two of such elements are shown merely by way of example in FIG. 1B), which guide the DUV radiation 108B onto a photomask 120.

The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved on their front face for beam shaping.

An air gap between the last lens element 128 and the wafer 124 can be replaced by a liquid medium 132 which has a refractive index of >1. The liquid medium 132 can be highpurity water, for example. Such a construction is also referred to as immersion lithography and has an increased photolithographic resolution. The medium 132 can also be referred to as an immersion liquid.

Figure 2A:
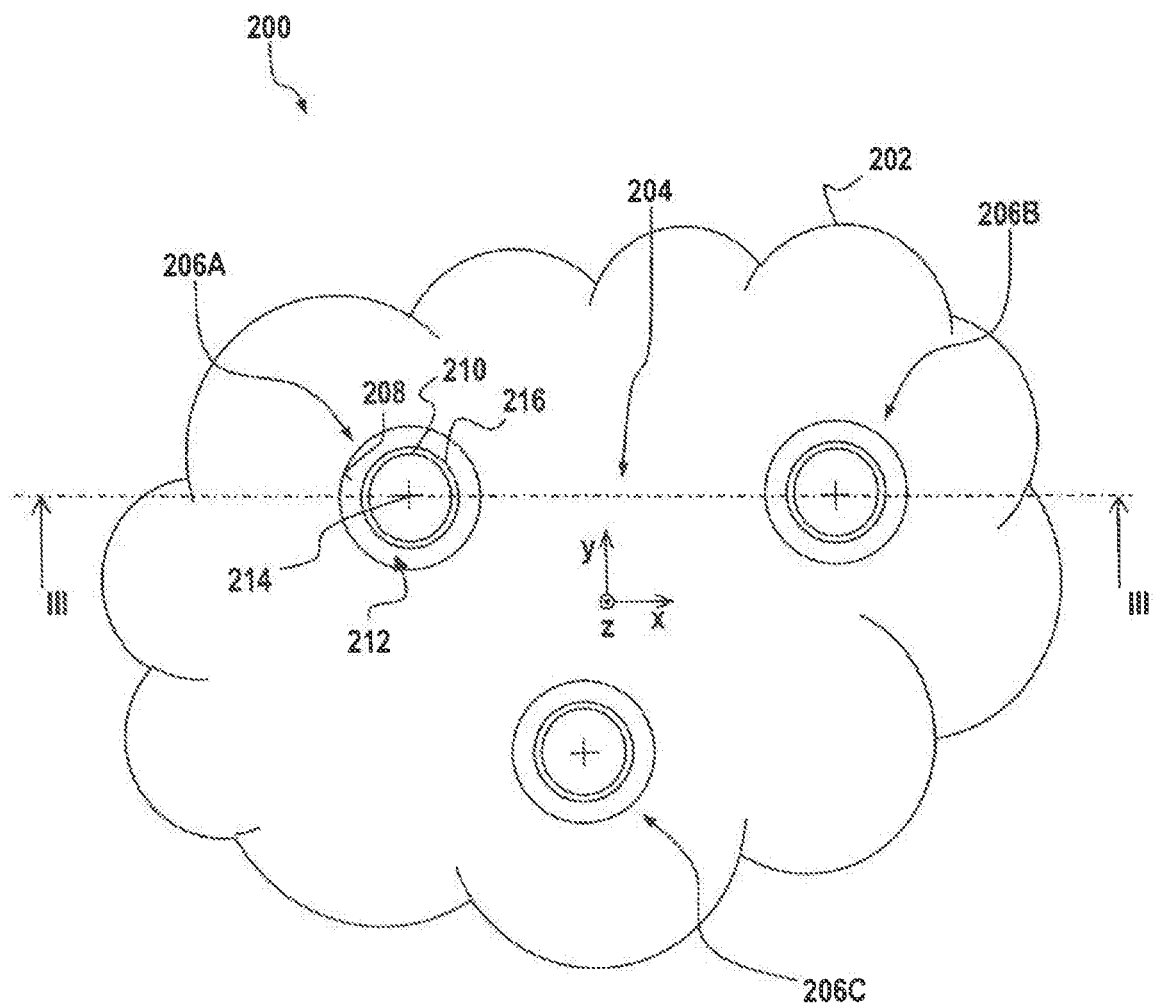
FIG. 2A shows as an excerpt a measuring system in accordance with one embodiment, wherein for example a generalized optical component is illustrated.

FIG. 2A shows, in a plan view, as an excerpt a measuring system 200 in accordance with one embodiment.

The measuring system 200 includes an optical component 202. The optical component 202 is for example a mirror, a lens element, an optical grating or a lambda plate. For example, it can be one of the mirrors 110 to 118, M1 to M6, 130, 131 or one of the lens elements 127, 128 from the illumination system 102 or projection system 104 of the EUV or DUV lithography apparatus 100A, 100B from FIG. 1A or 1B, respectively.

In accordance with the present exemplary embodiment, the optical component 202 is a mirror having an optically effective surface 204 (also referred to as "optical footprint"). The optically effective surface 204 reflects EUV light during operation.

Figure 2B:
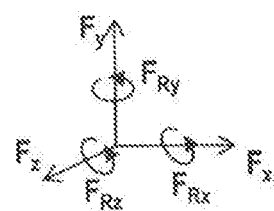
FIG. 2B shows six possible degrees of freedom of the optical component from FIG. 2A.

In principle, depending on the controlling actuator system, the optical component 202 can be moved in up to six degrees of freedom, specifically, as illustrated in FIG. 2B, in three translational degrees of freedom $F_x$, $F_y$, $F_z$ (that is to say a respective translation along the axes x, y, z in FIG. 2A) and three rotational degrees of freedom $F_{Rx}$, $F_{Ry}$, $F_{Rz}$ (that is to say a respective rotation about the axes x, y, z in FIG. 2A).

Movements of the optical component 202 in the six degrees of freedom are described by corresponding translation vectors x, y, z (for better clarity, in the present case no distinction is drawn between the translation vectors x, y, z and axes x, y, z in the figures) and rotation vectors $R_x$, $R_y$, $R_z$ (only $R_z$ is illustrated in the figures). It should be noted that the rotation vectors are composed in each case of a unit vector and an angle. The unit vector is coaxial with the respective translation vectors (thus for example translation in x and rotation about x). The angle indicates the absolute value of the rotation about the unit vector.

In accordance with the exemplary embodiment, the optical component 202 is moveable in two translational degrees of freedom $F_x$, $F_y$ and in one rotational degree of freedom $F_{Rz}$. However, any other combination of translational and rotational degrees of freedom is also conceivable.

The measuring system 200 includes by way of example three end stops 206A, 206B and 206C shown in FIG. 2A. For the sake of simplicity, explanations below relate to the end stop 206A, and are correspondingly applicable to the end stops 206B and 206C. Pegs 210 are secured to a section of the supporting frame which is shown by way of example in FIG. 3 and is provided there with the reference sign 300. The pegs 210 engage through cutouts 208 perpendicularly to the plane of the drawing in FIG. 2A. The cutouts 208 are introduced in the optical component 202. This is done for example by drilling a corresponding hole into the material of the mirror. Like the cutouts 208, the pegs 210 can have a circular-cylindrical cross section. This is also evident from FIG. 3, which shows a section III-III from FIG. 2A. In this case, there is a ring gap 212 between a respective cutout 208 and a respective peg 210.

This results in a mobility of the optical component 202 along the translation vectors x and y oriented perpendicularly to one another. The translation vectors x and y are oriented in each case perpendicularly to corresponding centre axes 214 of the pegs 210. The rotation vector $R_z$ extends perpendicularly to the translation plane thus defined. The rotation vector denotes a rotation of the optical component 202 in the xy-plane.

The end stops 206A, 206B, 206C limit the travel path x, y of the optical component 202 on account of a corresponding contact between the pegs 210 and the cutouts 208. In order to avoid damage to the optical component 202 on account of high acceleration, the peg 210 can be provided with a (soft) coating (for example composed of an elastomer, preferably fluoroelastomer). The coating is provided with the reference sign 216. By contrast, the inner wall of the cutout 208 is, for example, without a coating and thus embodied as comparatively hard.

Figure 3:
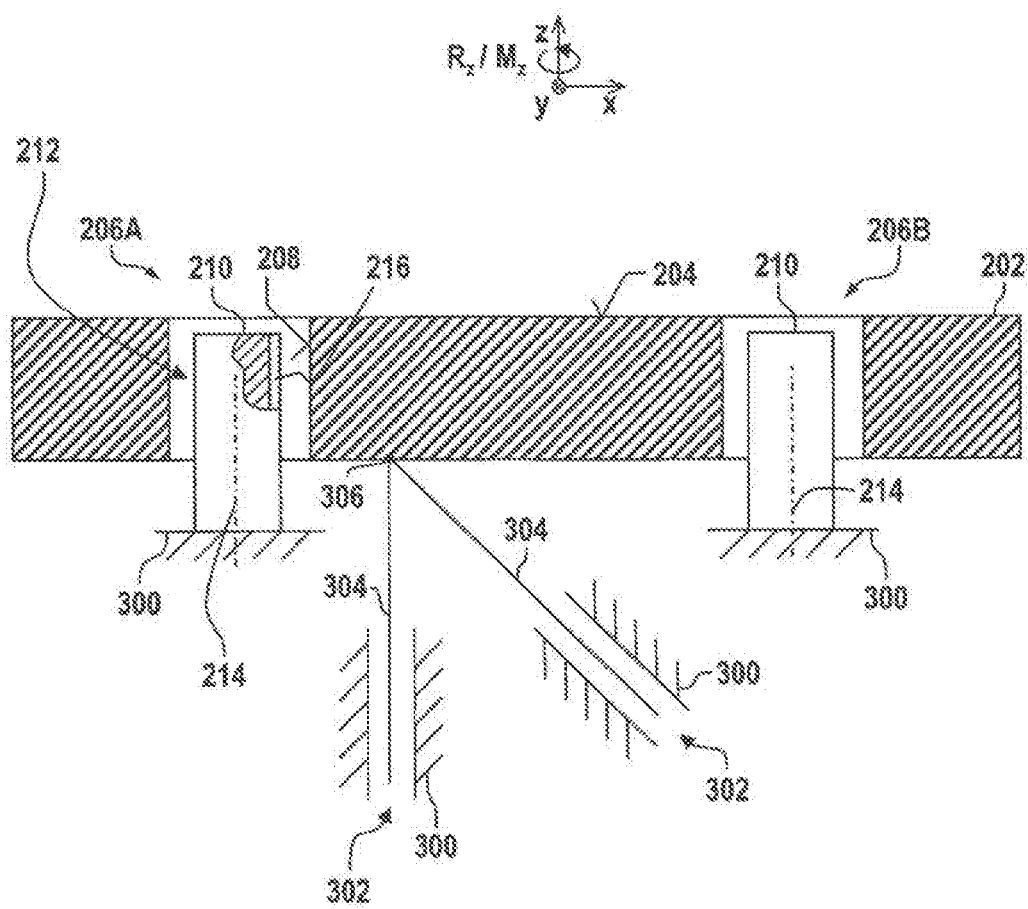
FIG. 3 shows a section from FIG. 2A, wherein one of the pegs together with coating is illustrated partly in cut-away fashion.

As can be seen in FIG. 3, the optical component 202 is adjustable in, depending on the embodiment, up to six degrees of freedom via—two illustrated by way of example—actuators 302, which engage on the optical component 202 in each case via corresponding pins 304. In accordance with the exemplary embodiment, the optical component 202 is adjustable in the translational degrees of freedom $F_x$ and $F_y$, and the rotational degree of freedom $F_{Rz}$ via the actuators 302.

Figure 4:
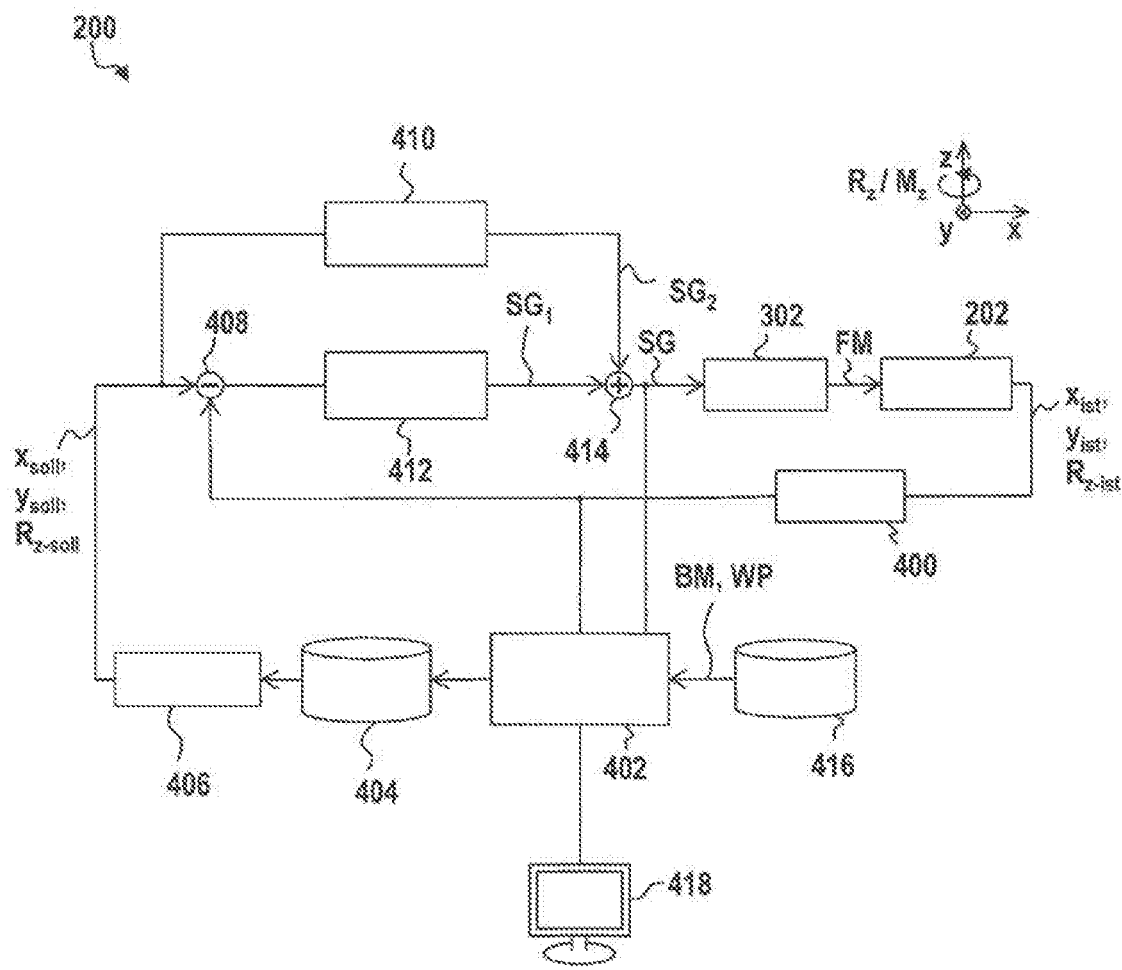
FIG. 4 schematically shows the measuring system from FIGS. 2 and 3 with further components.

FIG. 4 shows the measuring system 200 as a block diagram, wherein the optical component 202 from FIGS. 2 and 3 together with end stops 206A, 206B, 206C and the (mechanical) properties determining them is illustrated as a block.

The actuators 302 from FIG. 3 are also illustrated as a block in FIG. 4. The actuators generate a force and/or a torque FM, which has the effect that the optical component 202 moves in the degrees of freedom $F_x$, $F_y$, $F_{Rz}$ and in the process passes through actual positions, for example $x_{actual}$, $y_{actual}$, $R_{z-actual}$. In this case, $x_{actual}$ denotes the position of the optical component 202 along the x-axis, $y_{actual}$ denotes the position along the y-axis, and $R_{z-actual}$ denotes the angle of rotation about the z-axis.

The measuring system 200 furthermore includes a sensor unit 400, for example an optical sensor. The sensor unit 400 detects the actual positions $x_{actual}$, $y_{actual}$, $R_{z-actual}$ of the optical component 200.

The measuring system 200 furthermore includes a computer unit 402. By way of example, in regulation (exposure) operation (this is in contrast to operation or a method—described in even greater detail below—for localizing an abnormality 500 in a travel path x, y of the optical component 202—referred to below as "localizing method") of the lithography apparatus 100A, the computer unit determines the setpoint positions, for example $x_{setpoint}$, $y_{setpoint}$, $R_{z-setpoint}$, of the optical component 202. The latter are determined according to the desired properties ultimately imposed by the structure to be imaged on the wafer 124 (see FIG. 1A).

The setpoint positions $x_{setpoint}$, $y_{setpoint}$, $R_{z-setpoint}$ are buffer-stored for example on a storage unit 404 (for example hard disk or solid state drive) of the measuring system 200. A providing unit 406 (referred to as: setpoint generator) of the measuring system 200 finally provides the setpoint positions $x_{setpoint}$, $y_{setpoint}$, $R_{z-setpoint}$ both to a comparator unit 408 and to a feedforward control unit 410. The comparator unit 408 is connected to a regulator unit 412 of the measuring system 200 in terms of signalling.

The regulator unit 412 regulates a first part of a manipulated variable $SG_1$ (for a respective degree of freedom) as a function of the setpoint positions $x_{setpoint}$, $y_{setpoint}$, $R_{z-setpoint}$ and the actual positions $x_{actual}$, $y_{actual}$, $R_{z-actual}$. For this purpose, the setpoint and actual positions are compared with one another in the comparator unit 408 and a comparison value is provided to the regulator unit 412.

The regulator unit 412 is followed by an adding unit 414. The adding unit 414 adds the first part of the manipulated variable $SG_1$ and a second part of the manipulated variable $SG_2$ to form the manipulated variable SG.

The feedforward control unit 410, depending on the setpoint positions $x_{setpoint}$, $y_{setpoint}$, $R_{z-setpoint}$, provides the second manipulated variable $SG_2$ at the adding unit 414. For this purpose, by way of example, the following equation is stored on the feedforward control unit 414:

$$SG_2 = c^* x_{setpoint},$$

wherein c is a constant. Corresponding equations can be stored for $y_{setpoint}$, $R_{z-setpoint}$.

In other words, the feedforward control unit 410 supplies a value $SG_2$ for the force/torque FM to be generated by the actuators 302, which value can be calculated simply and therefore rapidly. The value $SG_2$ is corrected by the value $SG_1$ with the aid of the regulator unit 412 in order thus to move precisely to the desired position $x_{setpoint}$, $y_{setpoint}$, $R_{z-setpoint}$ on the basis of the actual position $x_{actual}$, $y_{actual}$, $R_{z-actual}$.

It is pointed out that the control and/or regulation of the movement of the optical component 202 can also have any other expedient set-up. In other words, a control and/or regulation of the movement of the optical component 202 can be implemented via the units 404, 406, 408, 412, 414 or else in some other way. The set-up illustrated here corresponds for example to that which is expedient in embodiments in which the measuring system 200 is integrated immediately into a lithography apparatus, for example into the lithography apparatus 100A or 100B. In this case, parts of the measuring system 200, such as e.g. the feedforward control unit 410 and the regulator unit, also serve for regulation (exposure) operation.

In an embodiment in which the measuring system 200 is embodied as a stand-alone solution (not integrated in lithography apparatuses), provision can be made for the optical component 200 together with the end stops 206A, 206B, 206C and also a corresponding section of the supporting frame 300 to be inserted as a module into the measuring system 200.

The computer unit 402, specifically independently of whether a stand-alone solution or integration into a lithography apparatus is implemented, is configured to detect and localize an abnormality, for example a particle 500 (see FIG. 5), in one or more of the ring gaps 212 of the end stops 206A, 206B, 206C.

The localizing method (as described below) can be followed—by the isolated measuring system 200 or a lithography apparatus 100A, 100B including such a system—if it is ascertained that the entire setpoint travel path of the optical component 200 is not available (first variant) or the setpoint travel path can be taken only with a force or torque FM, wherein the force or the torque FM exceeds a predefined threshold value (second variant). This ascertainment can be effected by the computer unit 402. For this purpose, the computer unit 402 is connected to the sensor unit 400 in the case of the first variant, and to the adding unit 414 in the case of the second variant, in order to detect the actuating signal SG provided for the actuators 302. Both variants are indicated in FIG. 4.

The localization of the abnormality 500 is carried out at least as a function of the detected actual rotation $R_{z\text{-}actual}$. Alternatively or additionally, in one embodiment, the sensor unit 400 can also be configured for detecting a torque $M_{z\text{-}actual}$ (for better clarity not shown in FIG. 4, but shown in FIGS. 7A and 7B) about the z-axis. In this case, as an alternative or in addition to the rotation about $R_z$, the computer unit 402 can use the detected torque $M_z$ about the z-axis to localize the abnormality 500 as a function thereof. Instead of the torque $M_z$, a force can also be sensed and taken into account by the computer unit 402 in the localization. This is not illustrated in greater detail, however.

Furthermore, the computer unit 402 can be connected to a storage unit 416 (for example hard disk or solid state drive) in terms of signalling. Predefined movement patterns BM are stored on the storage unit 416. The movement patterns BM describe for example setpoint positions $x_{setpoint}$, $y_{setpoint}$, $R_{z\text{-}setpoint}$ of the optical component 202 specifically for use in the localizing method. These values serve as input or predefined values for the feedforward control unit 410 and regulator unit 412 for controlling the actuators 302. The computer unit 404 can use the movement patterns BM in addition to the detected movement $R_{z\text{-}actual}$ and the detected torque $M_{z\text{-}actual}$ for localizing the abnormality 500.

Finally, the spatial arrangement of the end stops 206A, 206B, 206C, of the actuators 302 or of the engagement points 306 thereof on the optical component 202 and also the direction of the forces which they apply to the optical component 202 can be stored on the storage unit 416. These further parameters, designated by WP, can be provided to the computer unit 404, which uses these data to localize the abnormality 500 as a function thereof.

The further parameters WP can likewise include a so-called point of control (POC) of the optical component 202. This is the point of the optical component 202 to which is linked the coordinate system xyz to which all commanded and detected movements and forces/torques relate.

Figure 5:
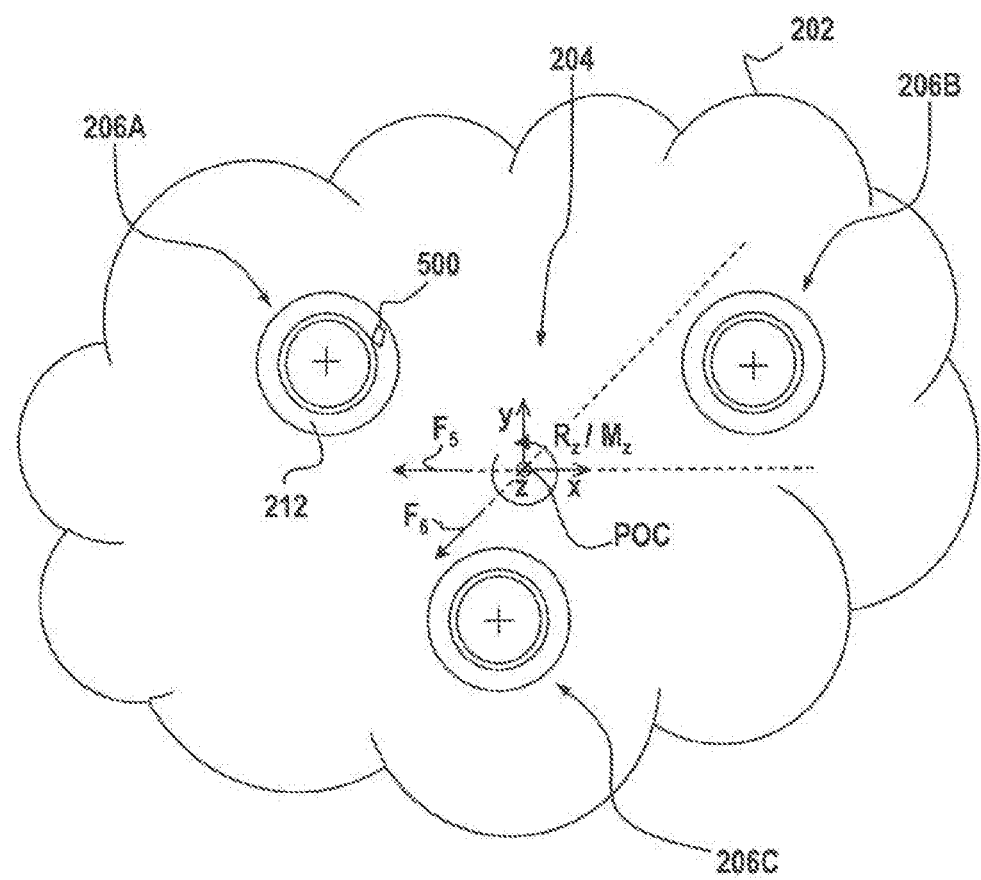
FIG. 5 shows the view from FIG. 2A in the fault situation.

FIG. 5 shows a particle 500 in the ring gap 212 of the end stop 206A. The particle 500 has the effect that a specified travel path of the optical component 202 cannot be taken via the actuators 302 in the xy-plane. This is because the particle 500 is not compressible or is only partly compressible and hence the coating 216 cannot completely compensate for the influence of the particle on the travel path and the force/torque FM of the actuators 302 is not sufficient for the desired compression.

Figure 6:
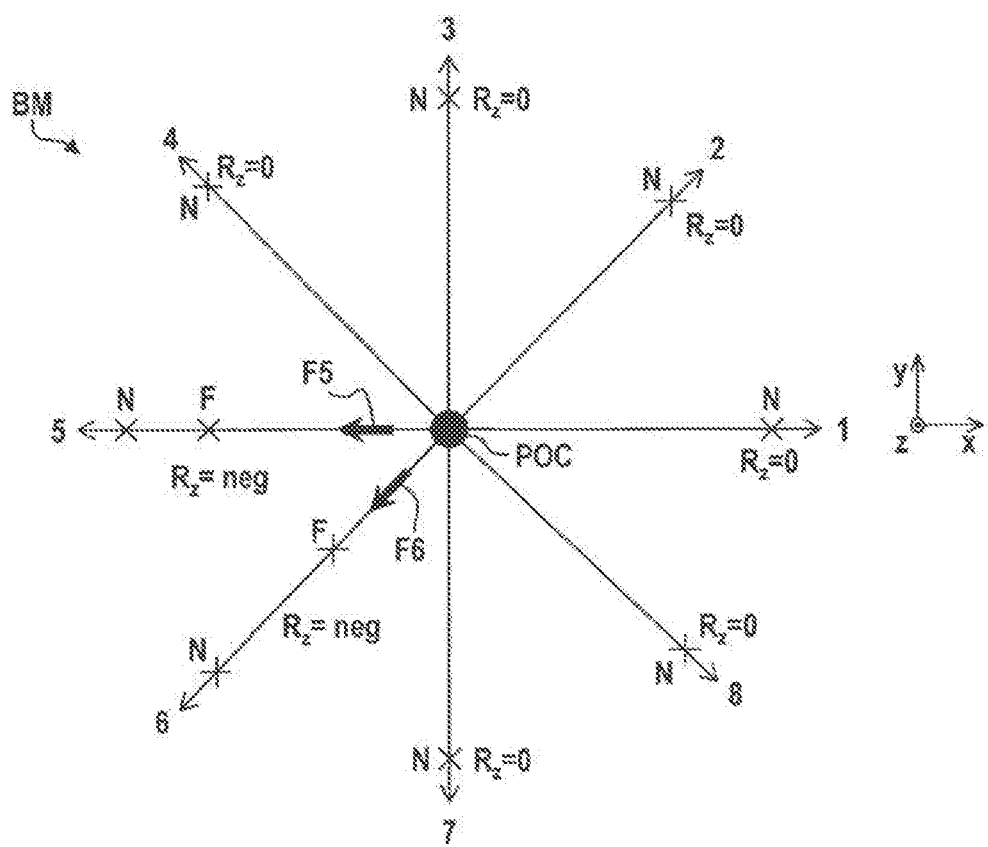
FIG. 6 shows an exemplary movement pattern applied to the optical component from FIG. 5, wherein for example the positions moved to for the normal situation and the positions moved to in the fault situation are illustrated in each case in the xy-plane and rotations about the z-axis are indicated.

FIG. 6 shows a movement pattern BM as stored on the storage unit 416. Spokes 1 to 8 are shown in this case. The spokes each denote a (translational) travel path of the optical component 202 in the xy-plane. Furthermore, those positions which can be moved to by the optical component 202 in the normal situation (not fault situation) are designated in each case by N in FIG. 6.

If there is an abnormality present, for example a particle 500, as shown in FIG. 5 (for example at the location therein), then the computer unit 402 will ascertain that the normal positions N on the spokes 5 and 6 cannot be moved to. Rather, the computing unit 402 ascertains a premature rise in the measured rotation $R_{z\text{-}actual}$ or the measured torque $M_{z\text{-}actual}$. As shown in FIG. 7A for the spoke 5 (corresponds to actual positions of the optical component 202 in the-x-direction), this rise deviates significantly from the normal situation N in the fault situation F.

Figure 7B:
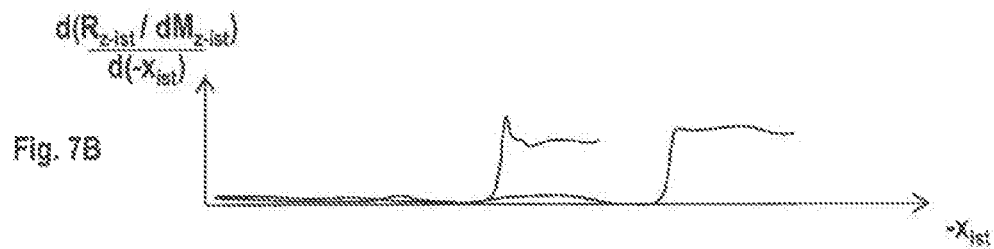
FIG. 7B shows the derivative of the rotation or torque with respect to the position with reference to FIG. 7A.
Figure 7A:
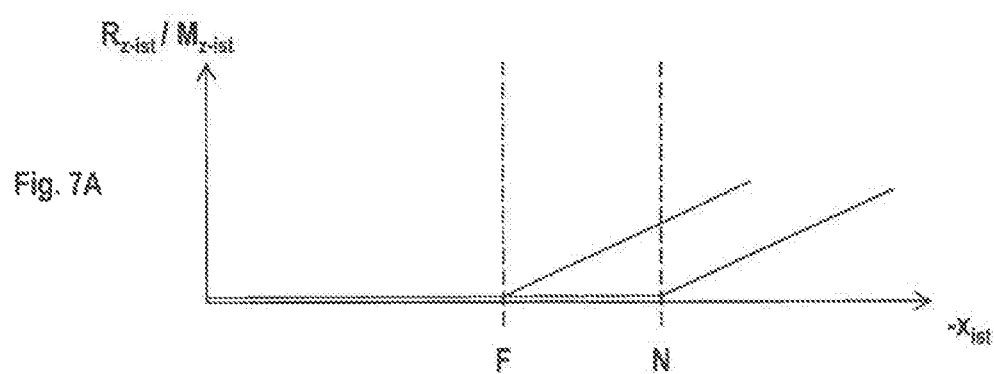
FIG. 7A shows a diagram showing the relationship of rotation or torque versus actual position for a spoke from FIG. 6.

For example, for this purpose it is possible to monitor the derivative $(d/d\text{-}x_{actual})$ of the measured rotation $R_{z\text{-}actual}$ or of the measured torque $M_{z\text{-}actual}$ with respect to the actual position $x_{actual}$, as shown in FIG. 7B. If the derivative exceeds a predefined threshold value, the computer unit 404 decides that a fault situation F is present.

It is pointed out that FIGS. 7A and 7B each show only one curve for $R_{z\text{-}actual}$ and $M_{z\text{-}actual}$. They are intended to illustrate the principle merely by way of example, which is why different curves for $R_{z\text{-}actual}$ and $M_{z\text{-}actual}$ are not shown. In FIGS. 7A and 7B, "/" should be understood as "or".

Returning then to FIG. 6, the latter also mentions the respective value for the monitored rotation $R_z$ on each spoke. For the spokes 1, 2, 3, 4, 7 and 8, the value from the exemplary embodiment according to FIG. 5 is in each case (ideally) 0, i.e. the respective end position N can be moved to, without a rotation occurring. The situation is different on the spokes 5 and 6. Here a negative rotation is sensed in each case (right hand rule).

For the spoke 5, the computer unit 402 can deduce from the knowledge of the Point of Control (POC) and the actuating force vector F5 that the particle 500 cannot be present in the ring gap 212 of the end stop 206C.

From the negative rotation for the spoke 6, the computer unit 404, once again taking account of the control force F6 can deduce for the spoke 6 that the particle 500 cannot be arranged in the ring gap of the end stop 206B.

Consequently, the computer unit 402 ascertains that the abnormality 500 is caused by the end stop 206A. The localization of the abnormality 500, here the end stop 206A, can be output for example in the measuring system 200 on a screen 418 (see FIG. 4) or in some other way. By way of example, the fact that the end stop 206A has the abnormality 500 can be displayed on the screen 418.

The logic according to which specific end stops, here 206B and 206C, can be excluded as fault sources (that is to say beset by an abnormality 500) results from the torques or rotational movements induced by a respective actuation force F5, F6. For elucidation, in this respect the axes along which these forces act are illustrated in a manner lengthened by dashed lines in FIG. 5.

It should moreover be pointed out that, instead of the computer unit 402, a person, via intellectual activity, can carry out the steps performed by the computer unit 404.

Figure 8:
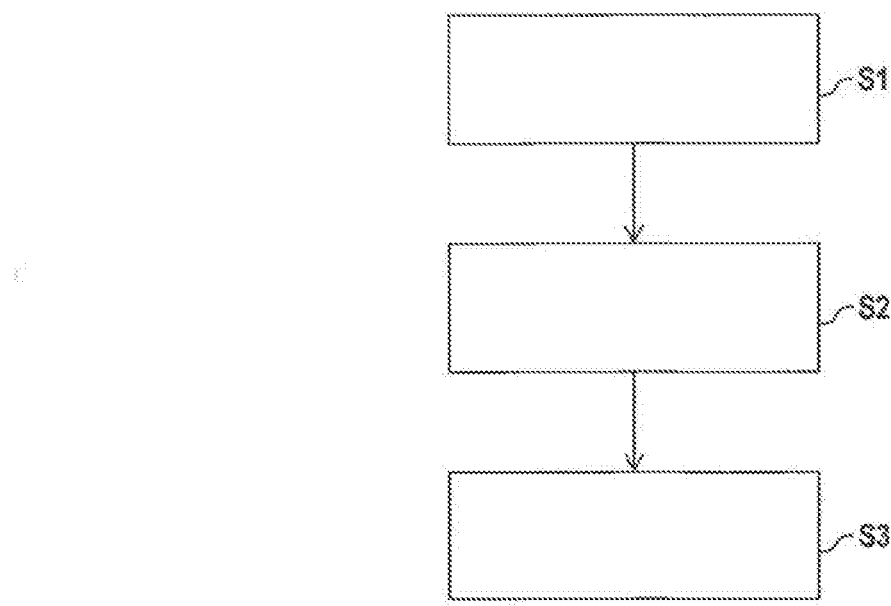
FIG. 8 shows a method in accordance with one embodiment in a flow diagram illustration.

FIG. 8 generally shows the method for localizing an abnormality 500 in a travel path (xy-plane) of the optical component 202 in accordance with one embodiment.

A step S1 involves moving the optical component 202 in the x- and y-directions. This corresponds to a movement in a first and second degree of freedom $F_x$, $F_y$, respectively.

A step S2 involves detecting a movement $R_z$ of the optical component 202 and/or a torque $M_z$ acting on the optical component 202 in at least one second degree of freedom $F_{Rz}$.

A step S3 involves localizing the abnormality, for example in the form of a particle 500, as a function of the movement $R_z$ detected and/or the torque $M_z$ detected.

Although the present disclosure has been described on the basis of exemplary embodiments, it is modifiable in diverse ways.

The respective unit, e.g. the sensor unit 400, the comparative unit 408, the feedforward control unit 410, the regulator unit 412 and/or the adding unit 414, can be implemented in terms of hardware technology and/or software technology. In the case of an implementation in terms of hardware technology, the respective unit can be embodied as a device or as part of a device, e.g. as a computer or as a microprocessor. In the case of an implementation in terms of software technology, the respective unit can be embodied as a computer program or part thereof, as a function, as a routine or as an executable object.

In the case of an implementation of the sensor unit 400 in terms of hardware technology, the sensor unit can be embodied for example as an optical, capacitive or inductive sensor.

LIST OF REFERENCE SIGNS 1 to 8 Spokes
100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 optical axis
127 Lens element
128 Lens element
130 Mirror
131 Mirror
132 Medium
200 Measuring system
202 Optical component
204 Optically effective surface
206A, 206B, 206C End stops
208 Cutout
210 Peg
212 Ring gap
214 Central axis
216 Coating
300 Supporting frame
302 Actuator
304 Peg
306 Point of Engagement
400 Sensor unit
402 Computer unit
404 Storage unit
406 Providing unit
408 Comparator unit
410 Feedforward control unit
412 Regulator unit
414 Adding unit
416 Storage unit
418 Screen
BM Movement pattern
F Fault situation
FM Force or torque
Fx translational degree of freedom in x
Fy translational degree of freedom in y
Fz translational degree of freedom in z
$F_{Rx}$ rotational degree of freedom about x
$F_{Ry}$ rotational degree of freedom about y
$F_{Rz}$ rotational degree of freedom about z
M1 Mirror
M2 Mirror
M3 Mirror
M4 Mirror
M5 Mirror
M6 Mirror
$M_z$ Torque
$M_{z\text{-}actual}$ Actual torque
N Normal situation
$R_z$ Rotation vector
$R_{z\text{-}actual}$ Actual position
$R_{z\text{-}setpoint}$ Setpoint movement
SG Manipulated variable
$SG_1$ first part of the manipulated variable
$SG_2$ second part of the manipulated variable
WP further parameters
x Translation vector or axis
$x_{actual}$ Actual position
y Translation vector or axis
$y_{actual}$ Actual position
z Translation vector or axis

What is claimed is:

1. A method, comprising:
   a) moving an optical component in a first degree of freedom;
   b) detecting a movement of the optical component in a second degree of freedom, and/or detecting a force acting on the optical component in the second degree of freedom; and
   c) localizing an abnormality in a travel path of the optical component based on the detected movement of the optical element in the second degree of freedom and/or the detected force of the optical element in the second degree of freedom.

2. The method of claim 1, wherein the first degree of freedom is a rotational degree of freedom, and the second degree of freedom is a translational degree of freedom.

3. The method of claim 1, wherein the first degree of freedom is a translational degree of freedom, and the second degree of freedom is a rotational degree of freedom.

4. The method of claim 3, further comprising using an end stop to limit the movement of the optical component in a).

5. The method of claim 1, wherein a) comprises moving the optical element in accordance with a predefined path or a predefined movement pattern.

6. The method of claim 5, wherein c) comprises localizing the abnormality in the travel path of the optical element based on at least one member selected from the group consisting of the predefined path, the predefined movement pattern, and an actuation force that moves the optical component in a).

7. The method of claim 6, wherein the first degree of freedom is a translational degree of freedom, and the second degree of freedom is a rotational degree of freedom.

8. The method of claim 5, wherein the first degree of freedom is a translational degree of freedom, and the second degree of freedom is a rotational degree of freedom.

9. The method of claim 1, wherein:
a) comprises moving the optical element in accordance with a predefined movement pattern which comprises a plurality of translational movements of the optical component in a plane; and
the translational movements proceed from a center point.

10. The method of claim 9, wherein c) comprises localizing the abnormality in the travel path of the optical element based on the predefined movement pattern.

11. The method of claim 10, wherein the first degree of freedom is a translational degree of freedom, and the second degree of freedom is a rotational degree of freedom.

12. The method of claim 9, wherein the first degree of freedom is a translational degree of freedom, and the second degree of freedom is a rotational degree of freedom.

13. The method of claim 1, a) further comprising detecting the movement of the optical element in the first degree of freedom, wherein c) further comprises localizing the abnormality based on the detected movement of the optical element in the first degree of freedom.

14. The method of claim 1, wherein c) comprises ascertaining that an end stop has the abnormality.

15. The method of claim 1, wherein an end stop comprises a peg which engages into a cutout of the optical component such that a ring gap is between the peg and the cutout.

16. The method of claim 15, wherein the abnormality comprises at least one member selected from the group consisting of a particle in the ring gap, a coating fault of the cutout, a coating fault of the peg, and an erroneous alignment of the peg relative to the cutout.

17. The method of claim 1, wherein the optical component comprises a member selected from the group consisting of a mirror, a lens element, an optical grating and a lambda plate.

18. The method of claim 1, wherein the optical element is an optical element in a lithography apparatus.

19. A measuring system configured to localize an abnormality in a travel path of an optical component, the measuring system comprising:
an actuator configured to move the optical component in a first degree of freedom;
a sensor unit configured to detect a movement of the optical component in a second degree of freedom and/or to detect a force acting on the optical component in the second degree of freedom; and
a computer unit configured to localize the abnormality based on based on the detected movement of the optical element in the second degree of freedom and/or the detected force of the optical element in the second degree of freedom.

20. An apparatus comprising:
an optical element; and
a measuring system configured to localize an abnormality in a travel path of the optical component, the measuring system comprising:
an actuator configured to move the optical component in a first degree of freedom;
a sensor unit configured to detect a movement of the optical component in a second degree of freedom and/or to detect a force acting on the optical component in the second degree of freedom; and
a computer unit configured to localize the abnormality based on based on the detected movement of the optical element in the second degree of freedom and/or the detected force of the optical element in the second degree of freedom,
wherein the apparatus is a lithography apparatus.

* * * * *

UNITED STATES PATENT AND TRADEMARK OFFICE
CERTIFICATE OF CORRECTION

PATENT NO. : 11,163,239 B2
APPLICATION NO. : 17/066076
DATED : November 2, 2021
INVENTOR(S) : Treubel et al.

It is certified that error appears in the above-identified patent and that said Letters Patent is hereby corrected as shown below:

In the Specification

Column 3, Line 9, delete "at at" and insert -- at --;

Column 4, Line 64, after "movement" insert -- . --;

In the Claims

Column 16, Line 18, Claim 19, delete "based on based on" and insert -- based on --;

Column 16, Line 35, Claim 20, delete "based on based on" and insert -- based on --.

Signed and Sealed this
Twenty-sixth Day of April, 2022

*Katherine Kelly Vidal*

Katherine Kelly Vidal
*Director of the United States Patent and Trademark Office*